(12) United States Patent
Thomsen

(10) Patent No.: US 6,349,058 B1
(45) Date of Patent: Feb. 19, 2002

(54) ELECTRONIC CIRCUIT AND METHOD FOR STORING CONFIGURATION AND CALIBRATION INFORMATION IN A NON-VOLATILE MEMORY ARRAY

(75) Inventor: Joseph A. Thomsen, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/785,121

(22) Filed: Feb. 16, 2001

(51) Int. Cl.⁷ .................................................. G11C 7/00
(52) U.S. Cl. .............. 365/185.08; 365/222; 365/230.08
(58) Field of Search ............................ 365/222, 185.08, 365/189.02, 230.08

(56) References Cited

U.S. PATENT DOCUMENTS 5,956,274 A * 9/1999 Elliott et al. ........... 365/189.02

* cited by examiner

Primary Examiner—Terrell W. Fears
(74) Attorney, Agent, or Firm—Baker Botts L.L.P.

(57) ABSTRACT

An electronic circuit includes a non-volatile memory that has several memory cells. The output of the non-volatile memory is connected to the inputs of several latches. Each latch has an output adapted to be read independently. A refresh circuit is connected to address lines of the non-volatile memory and to the write pins of each of the latches. The data contained in the memory cells of the non-volatile memory is represented by the data contained in the latches.

22 Claims, 3 Drawing Sheets

US 6,349,058 B1

ELECTRONIC CIRCUIT AND METHOD FOR STORING CONFIGURATION AND CALIBRATION INFORMATION IN A NON-VOLATILE MEMORY ARRAY

BACKGROUND OF THE INVENTION

The invention relates to electronic memory and, more particularly, to an electronic circuit and method for storing and accessing data.

DESCRIPTION OF THE RELATED TECHNOLOGY

Electronic devices are often identically manufactured in large numbers in order to decrease their average cost. The resulting devices may be intended for different uses. In addition the manufacturing process may result in some variation in the parameters of devices. In both of those cases, non-volatile memory can be used to store information that differentiates the devices.

When electronic devices that are manufactured in an identical manner are intended for use in different applications, functionality may be built into the devices that is triggered by the presence or absence of data in non-volatile memory. In a simple example, an electronic device may be used in one of two products. A single non-volatile bit is programmed with either a high or low voltage. A high voltage would enable functionality appropriate to the first product, while a low voltage would enable functionality appropriate for the second product. A greater amount of non-volatile memory would allow for greater diversity of function.

When electronic devices that are manufactured in an identical manner are intended for use in the same application, non-volatile memory may still be useful for storing data that calibrates the device. For example, a particular manufacturing process could result in variations in electrical parameters. A circuit could be included in the electronic device that modifies those parameters in accordance to the data in a non-volatile memory. A post-manufacture test could be performed to indicate the electrical parameter for a particular device. The non-volatile memory could then be programmed so that the modification circuit corrects any deviation from the desired value of the electrical parameter.

Non-volatile memory is also useful for other tasks in electronic devices as is known to those of skill in the art. Non-volatile memory circuits and methods of using non-volatile memory have utility in the electronic device industry.

SUMMARY OF THE INVENTION

The present invention is directed to an electronic circuit with non-volatile memory, a method for accessing non-volatile memory, and systems employing the circuit or method.

In one embodiment of the electronic circuit with non-volatile memory of the present invention, the non-volatile memory includes several memory cells each of which has a voltage state as data. The non-volatile memory also includes an output. Connected to that output are the inputs of a plurality of latches. The latches can be read independently through their outputs. A refresh circuit is coupled to the address lines of the non-volatile memory and is also coupled to the write inputs of the latches. The data contained in the memory cells of the non-volatile memory is represented by the data contained in the latches.

In a more specific embodiment of the present invention, the non-volatile memory is EEPROM (electrically erasable programmable read-only memory). In another more specific embodiment of the invention, the circuit includes a timer that activates the refresh circuit at a specified frequency. In another more specific embodiment of the invention, the circuit includes a detector for each latch. The detectors monitor the data in the latches and generate a signal when the data changes. In response to the signal, the refresh circuit is activated.

In a method embodiment of the present invention, a non-volatile memory is programmed with a plurality of bits representing differentiation data. The differentiation data is sequentially output to a set of latches. At least two of the latches are simultaneously accessed for their copy of the differentiation data.

In another more specific method embodiment of the invention, the step of sequentially outputting the differentiation data to the latches occurs at power up. In another more specific embodiment of the invention, the contents of each latch are monitored. If a change in state is detected a signal is generated. In response to the signal, the differentiation data is sequentially output from the non-volatile memory. In another embodiment, the signal also halts a system. In more specific method embodiments of the invention, the differentiation data is calibration or configuration data.

A feature of the invention is accessing non-volatile memory in an electronic circuit.

Another feature is storing differentiation data in an electronic circuit.

Another feature is monitoring data integrity in an electronic circuit.

An advantage of the present invention is simultaneous access to multiple differentiation bits.

Another advantage is accurately maintained differentiation data.

Still another advantage is reduced circuit implementation area.

Another advantage is post-manufacture calibration.

Another advantage is post-manufacture configuration.

Other and further features and advantages will be apparent from the following description of presently preferred embodiments of the invention, given for the purpose of disclosure and taken in conjunction with the accompanying drawings. Not all embodiments of the invention will include all the specified advantages. For example, one embodiment may only accurately maintain differentiation data, while another only reduces circuit implementation area.

DETAILED DESCRIPTION OF THE PREFERRED EMBODIMENTS

Figure 1:
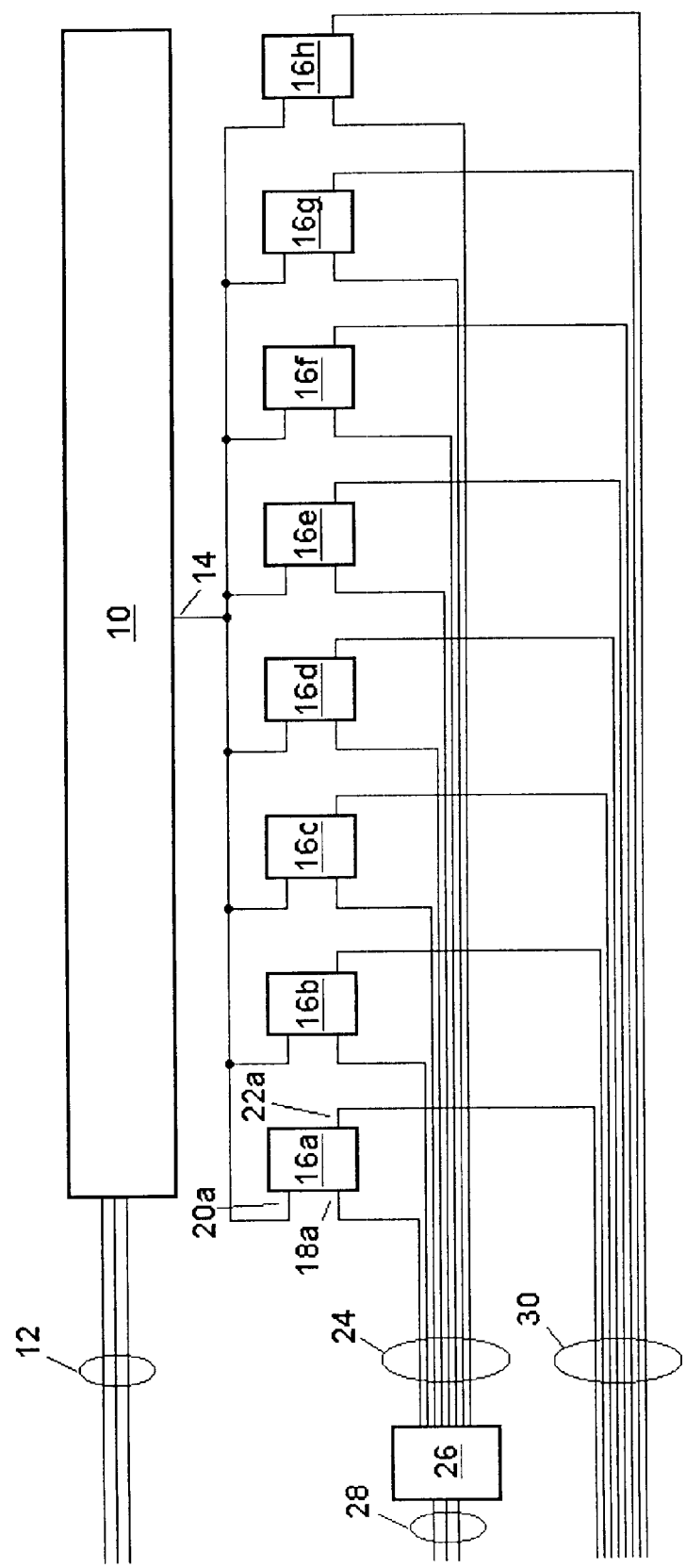
FIG. 1 is a circuit diagram of a first portion of one embodiment of an electronic circuit with accessible non-volatile memory.

Referring now to the drawings, the details of preferred embodiments of the invention are schematically illustrated.

Like elements in the drawings will be represented by like numbers, and similar elements will be represented by like numbers with a different lower case letter suffix.

Referring to FIG. 1, a circuit diagram of a first portion of one embodiment of an electronic circuit with accessible non-volatile memory is illustrated. The electronic circuit can be fabricated as a portion of a larger integrated circuit. The integrated circuit package may be, for example, but not limited to, plastic dual in-line package (PDIP), small outline (SO), shrink small outline package (SSOP), thin shrink small outline package (TSSOP), windowed ceramic dual in-line package (CERDIP), leadless chip carrier (LCC), plastic leaded chip carrier (PLCC), plastic quad flatpack package (PQFP), thin quad flatpack package (TQFP), pin grid array (PGA), ball grid array (BGA), TO-220, T0-247 and TO-263.

The electronic circuit includes a non-volatile memory array 10. By way of example and for ease of illustration, the non-volatile memory array 10 is assumed to have eight memory cells. Those of skill in the art are aware that non-volatile memory can be fabricated with a specified number of memory cells. In some processes, single non-volatile memory cells are unavailable or are prohibitively large. The non-volatile memory array 10 is able to place the voltage state of one of its memory cells at its output 14. Address lines 12 indicate in binary fashion the cell whose voltage state will appear at the output 14. The three address lines 12 are capable of eight distinct binary combinations. The non-volatile memory array 10 can also include both rows and columns, in which case the address lines 12 could include address lines for the rows and address lines for the columns. The non-volatile memory array 10 can also include a pin for activating the output 14. In that case an additional line would carry a signal to activate the output after the address of the desired memory cell was place on the address lines 12. The non-volatile memory array 10 is an EEPROM. In an alternate embodiment, the non-volatile memory array 10 is an EPROM (erasable programmable read-only memory). Other types of non-volatile memory can be used in other embodiments.

The output 14 of the non-volatile memory array 10 is connected to eight latches 16a–h. The connections of the latches are shown with respect to the first latch 16a for ease of illustration. Each latch includes a write input 18a, a data input 20a, and an output 22a. The latches 16a–h operate to store the voltage stage present at the data input 20a whenever the voltage state at the write input 18a is high. In an alternative embodiment, a low write input 18a activates storage of the voltage state at the data input 20a. The output 22a has the stored voltage state.

The outputs of the latches 16a–h are coupled to other portions of the circuit by conductive traces 30. The write inputs of the latches 16a–h are connected to an addressing circuit 26. The addressing circuit 26 receives three inputs 28 that represent a number between one and eight inclusively, in binary format. The addressing circuit 26, places a voltage state on one of its outputs 24 that activates the write input of one of the latches 16a–h. The output 24 chosen corresponds to the number represented by the voltage states of the inputs 28.

Figure 2:
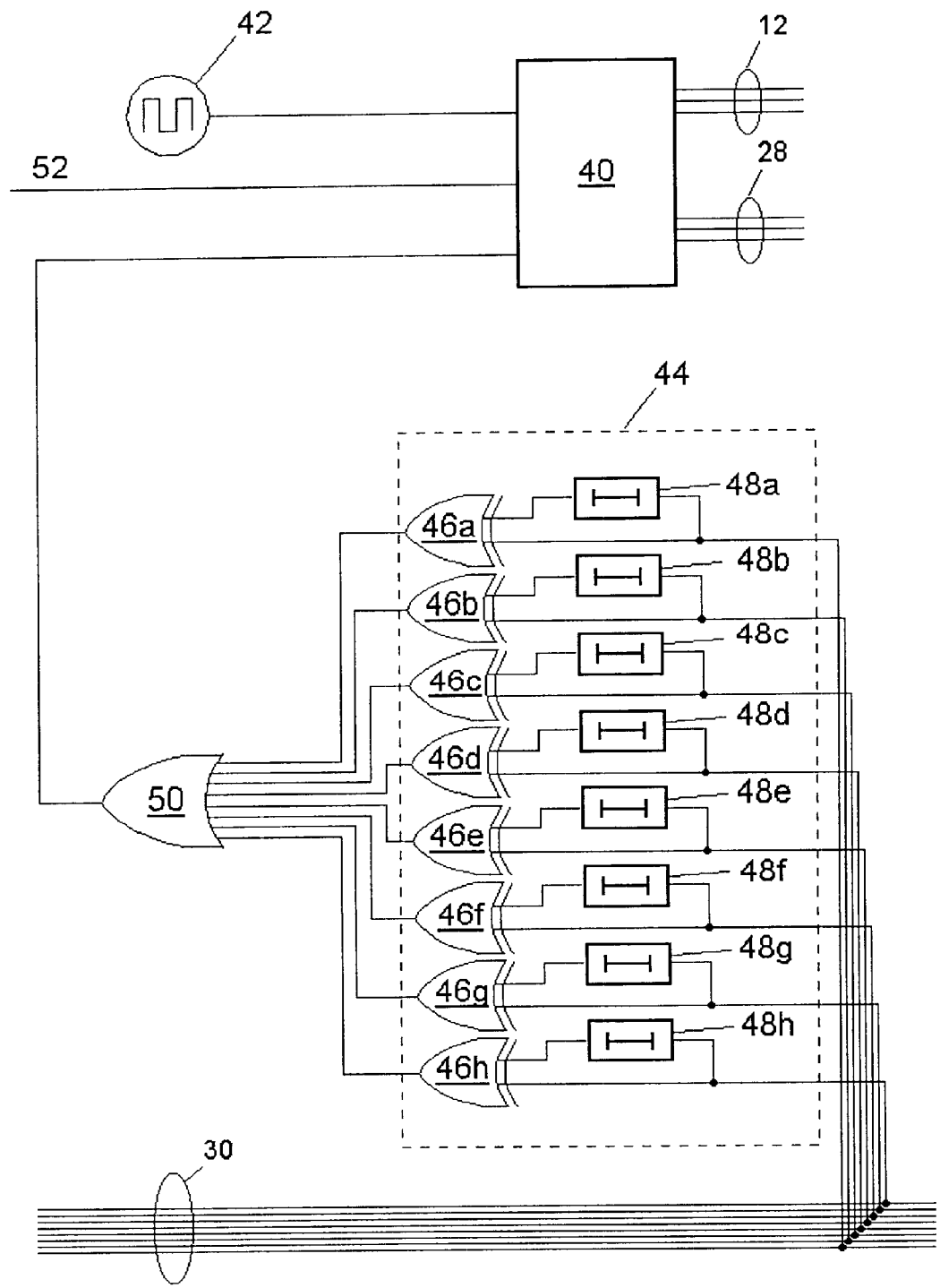
FIG. 2 is a circuit diagram of a second portion of one embodiment of an electronic circuit with accessible non-volatile memory.

Referring to FIG. 2, a circuit diagram of a second portion of one embodiment of an electronic circuit with accessible non-volatile memory is illustrated. The traces 30 carrying the outputs of the latches 16a–h are provided to other portions of the electronic circuit that utilize the configuration or calibration data they carry. The signals on the traces 30 are also provided to a detector 44. In one embodiment, the detector includes exclusive or gates 46a–h coupled to delay circuits 48a–h. As long as the signals on the traces are consistent, each exclusive or gate will receive either two low voltages or two high voltages. When the exclusive or gates 46a–h receive identical inputs, each outputs a low voltage. When an or gate 50 receives all low voltages, it outputs a low voltage. If the voltage state on one of the traces 30 changes, however, that change is applied to one input of one of the exclusive or gates 46a–h immediately. For some amount of time, the other input receives the unchanged signal, because of the delay circuit 48a–h. The exclusive or gate outputs a high voltage, because of the different inputs, for the amount of time that it takes for the changed signal to traverse the delay circuit. The or gate 50 responds to a single high voltage by outputting a high voltage iteself indicating that the state of one of the latches 16a–h has changed.

In alternate embodiments, other detectors can be used. For example, a cyclic redundancy check could be used. A single bit corresponds to whether the number of high voltages on the traces 30 is odd or even. A single exclusive or gate and delay circuit could then be used to monitor the state of that bit. In alternate embodiments, a circuit different than the combination of exclusive or gate with delay can be used. Detectors of voltage state change are known in the art.

The detector 44 drives the or gate 50 to produce a signal indicating whether one of the latches 16a–h has changed state. That signal is received by a state machine 40. The state machine 40 is a specific embodiment of a refresh circuit. It receives signals from the detector 44 and a timing circuit 42. It provides signals to the non-volatile memory array 10, the addressing circuit 26, and to other portions of the electronic circuit or system 52. At power up of the electronic circuit, the non-volatile memory array 10 has differentiation data, retained while power was off because it is non-volatile, while the latches 16a–h store only their initial data state. The state machine 40 generates signals to store the voltage states of the memory cells of the non-volatile memory array 10 in the latches 16a–h. This process is described in more detail with reference to FIG. 3.

State machine 40 also responds to a signal from the or gate 50, by storing the non-volatile memory array 10 values in the latches 16a–h. The differentiation data in the latches 16a–h is refreshed both at system power up and upon the detector 44 generating a signal indicating that the voltage states of the latches 16a–h have been corrupted. Such corruption can occur as a result of EMI or other noise event. In the event of corruption, the state machine can also output a signal to a system or other portions of the electronic circuit on line 52. That signal indicates that corruption has been detected. The system or other portion of the electronic circuit can halt to wait for the signal on line 52 to be deasserted. Halting the system reduces the risk that errors will occur as a result of the corruption. In an alternate embodiment, the signals on the traces 30 are delayed so that line 52 will be asserted before a corrupted signal reaches the system or other portions of the electronic circuit. After refreshing the differentiation data on the latches 16a–h, the state machine can deassert line 52.

Timing circuit 42 provides signals to the state machine 40 at a predetermined frequency. In response to signals from the timing circuit 42, the state machine 40 refreshes the differentiation data on the latches 16a–h. The timing circuit 42 can be adjustable. For example, the state machine can be programmed to increase the frequency of the timing circuit 42 if too many corruption events are detected in a given period.

Figure 3:
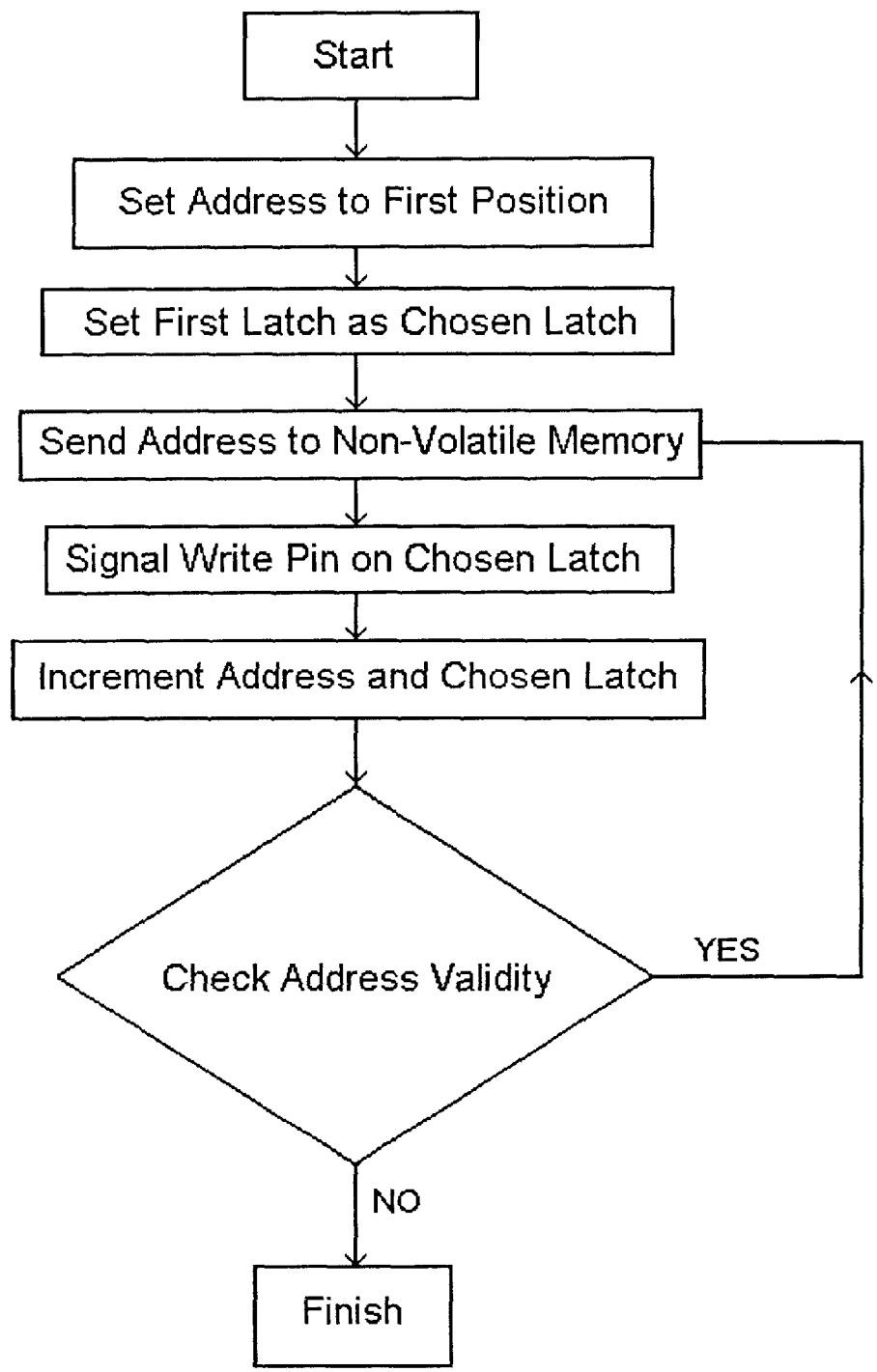
FIG. 3 is a flow diagram of a method for refreshing latches based on non-volatile memory.

Referring to FIG. 3, a flow diagram of a method for refreshing latches based on non-volatile memory is illustrated. The refresh begins by setting an address to a first position in the non-volatile memory array 10. One of the latches 16*a–h* is then designated as the chosen latch. Voltage states are then placed on the address lines 12 such that the non-volatile memory array 10 places a voltage state on its output corresponding to the voltage state stored in one memory cell. That voltage is present at the data input 20*a* of each of the latches 16*a–h*. The inputs 28 of the addressing circuit 26 are signaled with the address of the chosen latch. The addressing circuit 26 activates the write input 18*a* of the chosen latch 16*a–h*. In response, the chosen latch stores the voltage state of the memory cell. The memory cell address and chosen latch are then incremented. If the memory cell address is no longer valid, e.g., has wrapped to an address already used, the refresh is done. Otherwise, the next voltage state is transferred.

The invention, therefore, is well adapted to carry out the objects and attain the ends and advantages mentioned, as well as others inherent therein. While the invention has been depicted and described and is defined by reference to particular embodiments of the invention, such references do not imply a limitation on the invention, and no such limitation is to be inferred. The invention is capable of considerable modification, alternation and equivalents in form and function, as will occur to those ordinarily skilled in the pertinent arts. The depicted and described embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. An electronic circuit for accessing non-volatile memory, comprising:

a non-volatile memory including a plurality of non-volatile memory cells each having a voltage state, the non-volatile memory having an output;

a plurality of latches each having an input connected to the output of the non-volatile memory and each having an output adapted to be read independently from the outputs of the other latches of the plurality of latches;

a refresh circuit connected to address lines of the non-volatile memory and connected independently to a write input of each of the latches; and wherein for each of the plurality of non-volatile memory cells one of the plurality of latches has the same voltage state.

2. The circuit of claim 1, wherein the non-volatile memory is programmable.

3. The circuit of claim 1, wherein the refresh circuit activates upon power up.

4. The circuit of claim 1, further comprising:

a timer for activating the refresh circuit at least once during a specified period.

5. The circuit of claim 1, further comprising:

a plurality of detectors, each coupled to the output of one of the plurality of latches and adapted to generate a signal when the voltage state of latch changes.

6. The circuit of claim 5, wherein each detector comprises a delay circuit coupled to one input of an exclusive or gate.

7. The circuit of claim 5, wherein the refresh circuit is coupled to the plurality of detectors and activates when at least one of the plurality of detectors generates a signal.

8. The circuit of claim 1, wherein the non-volatile memory is an EEPROM.

9. The circuit of claim 8, wherein the plurality of latches are CMOS latches.

10. The circuit of claim 1, wherein the non-volatile memory is an EPROM.

11. The circuit of claim 1, wherein the plurality of latches are discrete CMOS latches.

12. A method for accessing a non-volatile memory array, comprising the steps of:

coupling an output of the non-volatile memory array to a plurality of latches;

storing a value in each of the plurality of latches that is based on a value from the memory array;

accessing at least two values stored in the plurality of latches simultaneously.

13. The method of claim 12, wherein the step of storing a value includes the step of storing a copy of a value from the memory array in each of the plurality of latches.

14. The method of claim 12, wherein the step of storing a value includes the step of storing an inverse of a value from the memory array in each of the plurality of latches.

15. A method for storing data, comprising the steps of:

programming a non-volatile memory with data comprising a plurality of bits; sequentially outputting each bit of the data to one of a plurality of latches; and simultaneously accessing at least two bits of data from the plurality of latches.

16. The method of claim 15, wherein the data is configuration data.

17. The method of claim 15, wherein the data is calibration data.

18. The method of claim 15, wherein the step of sequentially outputting occurs at power up.

19. The method of claim 15, further comprising the steps of:

monitoring the bits of data stored in the plurality of latches; and generating a signal when at least one bit of data stored in the plurality of latches changes.

20. The method of claim 19, further comprising the step of:

sequentially outputting each bit of the data to one of the plurality of latches in response to the signal.

21. The method of claim 19, further comprising the step of:

halting operation of a system in response to the signal.

22. The method of claim 15, wherein the step of sequentially outputting occurs at a minimum rate.

* * * * *